(12) United States Patent
Jiang et al.

(10) Patent No.: US 8,420,237 B1
(45) Date of Patent: Apr. 16, 2013

(54) ADHERENT COATING ON CARBIDE AND CERAMIC SUBSTRATES

(76) Inventors: Wenping Jiang, Fayetteville, AR (US); Mike Kimmel, Rogers, AR (US); Ajay P. Malshe, Springdale, AR (US); Brett McAfee, Fayetteville, AR (US)

(*) Notice: Subject to any disclaimer, the term of this patent is extended or adjusted under 35 U.S.C. 154(b) by 0 days.

(21) Appl. No.: 13/450,697

(22) Filed: Apr. 19, 2012

Related U.S. Application Data

(60) Provisional application No. 61/600,985, filed on Feb. 20, 2012.

(51) Int. Cl.
*B32B 9/00* (2006.01)
*B32B 19/00* (2006.01)
*B32B 5/16* (2006.01)
*B24B 1/00* (2006.01)
*B24D 11/00* (2006.01)

(52) U.S. Cl.
USPC .............................. 428/698; 428/328; 51/295

(58) Field of Classification Search .................. 428/328, 428/336, 698, 699; 407/118, 119; 51/295; 83/684; 427/255.15
See application file for complete search history.

(56) References Cited

U.S. PATENT DOCUMENTS

| | | | |
|---|---|---|---|
| 4,406,667 A | 9/1983 | Sarin et al. | |
| 4,406,670 A | 9/1983 | Sarin et al. | |
| 4,892,792 A | 1/1990 | Sarin et al. | |
| 4,984,940 A * | 1/1991 | Bryant et al. | 407/119 |
| 5,981,078 A | 11/1999 | Tabersky et al. | |
| 6,228,483 B1 | 5/2001 | Sarin | |
| 6,325,710 B1 | 12/2001 | Mikus | |
| 6,447,890 B1 | 9/2002 | Leverenz et al. | |
| 6,599,062 B1 * | 7/2003 | Oles et al. | 407/119 |
| 2002/0112588 A1 * | 8/2002 | Lee | 83/684 |
| 2005/0003238 A1 | 1/2005 | Leverenz et al. | |
| 2008/0196318 A1 | 8/2008 | Bost et al. | |
| 2010/0166512 A1 * | 7/2010 | Tanibuchi | 407/119 |

* cited by examiner

*Primary Examiner* — Pegah Parvini
(74) *Attorney, Agent, or Firm* — J. Charles Dougherty

(57) ABSTRACT

An adherent coating for carbide and ceramic substrates employs a thin layer of hafnium nitride (HfN) between the substrate and a subsequent layer or layers. The thin layer may be employed without thermal cracking due to heat during use, such as for the insert of a cutting tool, because the upper layer or layers provide a gradual transition of material properties to a harder, less thermally conductive material on the outermost layer. A particular arrangement of layers on the carbide or ceramic substrate and hafnium nitride layer may be, from innermost to outermost layer, titanium carbide, aluminum oxide, and titanium nitride.

18 Claims, 2 Drawing Sheets

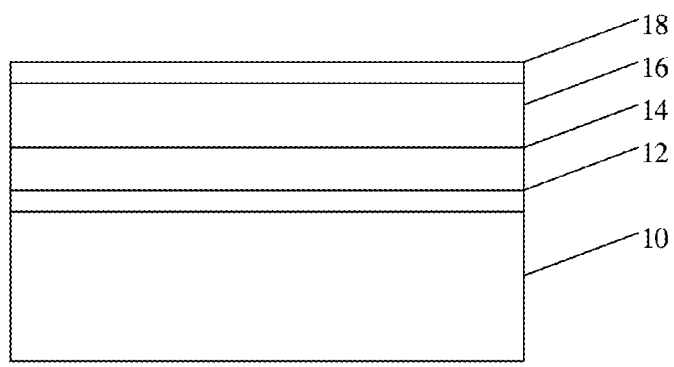
Fig. 1
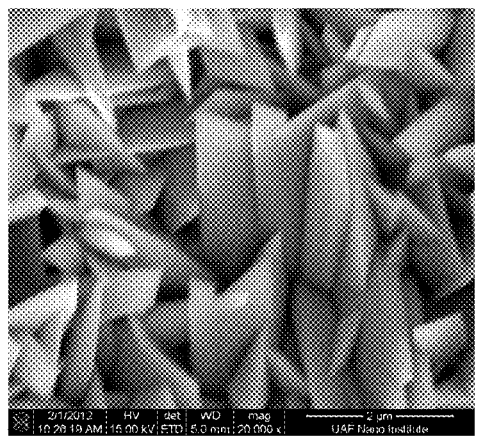 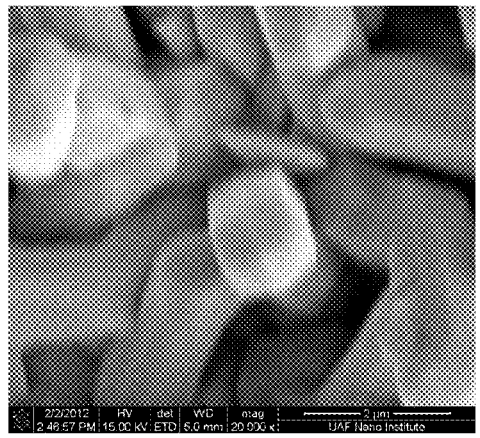
Fig 2A   Fig 2B

ADHERENT COATING ON CARBIDE AND CERAMIC SUBSTRATES

CROSS-REFERENCE TO RELATED APPLICATIONS

This application claims priority from U.S. provisional patent application No. 61/600,985, filed Feb. 20, 2012, and entitled "Adherent Coating on Carbide and Ceramic Substrates."

STATEMENT REGARDING FEDERALLY SPONSORED RESEARCH OR DEVELOPMENT

Not applicable.

BACKGROUND OF THE INVENTION

Coatings are effective for improving the performance of various materials, such as for achieving better wear resistance and corrosion resistance. Common applications where a coating is applied to a substrate to improve wear resistance of the substrate material include cutting tool inserts for the cutting of hard materials, such as steel. Common substrate materials for cutting tools may include, for example, steel, other hard metals, and ceramics. The desired outer coating for the substrate may be of a material that does not bond well with the material of which the substrate is formed. Due to thermal expansion differences, typical coatings of materials such as titanium carbide, titanium carbonitride, titanium nitride, zirconia carbonitride and aluminum oxide do not adhere well to ceramic substrates, especially silicon nitrides and aluminum oxides.

Many coatings using these materials are produced at high temperature, which results in eta phases in the coating. Eta phases are a carbon-deficient form of a carbide material that result in a harder, much more brittle cemented carbide structure, which due to its brittle properties is prone to breakage. This breakage reduces the wear life of the cutting tool. An interfacial layer may be used to seal the substrate and prevent the formation of eta phase material. An adherent layer of a different material that is positioned as an interfacial layer between the substrate and the outer coating(s) may therefore be desired.

Hafnium nitride (HfN) has been explored as a coating material in the development of cutting tools. A desirable property of HfN in such applications is that it tends to "bend" rather than fracture under high-temperature conditions. It thus exhibits a good resistance to thermal cracking during cutting tool use. U.S. Pat. No. 4,406,667 to Sarin et al. teaches a composite substrate having a coating of a refractory metal nitride, including hafnium nitride as one example coating material.

Despite its resistance to thermal cracking, HfN is relatively soft when compared to other known cutting tool coating materials, and thus quickly wears away if used as the only coating on a cutting tool substrate. Cutting tool inserts using HfN as the only substrate coating layer or as the outer substrate coating layer are thus not widely used. U.S. Pat. No. 6,447,890 to Leverenz et al. teaches a hard metal substrate with two coatings, the first coating in contact with the substrate being of various potential materials, including a metal nitride of a group of metals including hafnium. The second coating may be a metal carbide, metal nitride, or metal oxide, including aluminum oxide ($Al_2O_3$). Thus Leverenz et al. '890 teaches HfN as a potential inner layer material with a harder material used as an overcoat or outer layer. Leverenz et al. '890 teaches, however, that the HfN first coating should be at least about 2 microns in thickness, preferably at least about 2 microns to 5 microns in thickness. Leverenz et al. '890 teaches that this innermost layer is provided to inhibit thermal cracking, and further that the specific thickness of at least 2 microns for the inner HfN layer is preferred so as to reduce the occurrence of cracks during the cutting process, which can lead to failure.

While HfN used as an interfacial layer does provide resistance to cracking for cutting tool inserts, the application of a thick HfN coating as taught by Leverenz et al. '890 significantly increases production costs for cutting tool inserts. Hafnium is itself a rare and expensive material, and the processes required to apply a coating in the thickness range specified by Leverenz et al. '890 require a substantial amount of coating time to achieve. Thus the time to produce each cutting tool insert is significantly increased, thereby lowering the overall manufacturing efficiency associated with the production of such cutting tool inserts, and significantly increasing their cost. For this reason, a cutting tool with improved resistance to thermal cracking, but that does not require the increased production time associated with a thick HfN interfacial layer, is highly desired.

References mentioned in this background section are not admitted to be prior art with respect to the present invention.

BRIEF SUMMARY OF THE INVENTION

The present invention is directed to a substrate with an inner coating comprising a thin layer of HfN material, the thickness of the HfN material being less than 2 microns, potentially with one or more additional layers of material over the HfN layer. The present invention has achieved the advantages of the HfN interfacial layer for resistance to cracking, but has done so using a thin HfN coating, which significantly lowers the manufacturing time and production cost associated with the resulting product.

In a first aspect, the invention is directed to a tool comprising a substrate comprising at least one of a carbide and a ceramic; and a first coating comprising hafnium nitride wherein the first coating has a thickness of less than 2 microns.

In a second aspect, the invention is directed to a method for depositing a layer of hafnium nitride on a substrate, the method steps comprising positioning the substrate in a reactor; introducing a hafnium generator into the reactor; providing a flow of chlorine gas into the generator to produce a reaction with the hafnium sponge resulting in hafnium chloride; and introducing molecular nitrogen and molecular hydrogen into the reactor to produce a hafnium nitride vapor, wherein the hafnium nitride vapor interacts with the substrate to produce a hafnium nitride coating on the substrate wherein the resulting hafnium layer on the substrate is less than two microns thick.

These and other features, objects and advantages of the present invention will become better understood from a consideration of the following detailed description of the preferred embodiments and appended claims in conjunction with the drawings as described following:

BRIEF DESCRIPTION OF THE SEVERAL VIEWS OF THE DRAWINGS

FIG. 1 is an illustration of a substrate with multiple coatings according to a preferred embodiment of the present invention.

FIGS. 2A and 2B are SEM photographs in a top planar directional view of a HfN layer according to a preferred embodiment of the present invention.

DETAILED DESCRIPTION OF THE PREFERRED EMBODIMENT(S)

Figure 3:
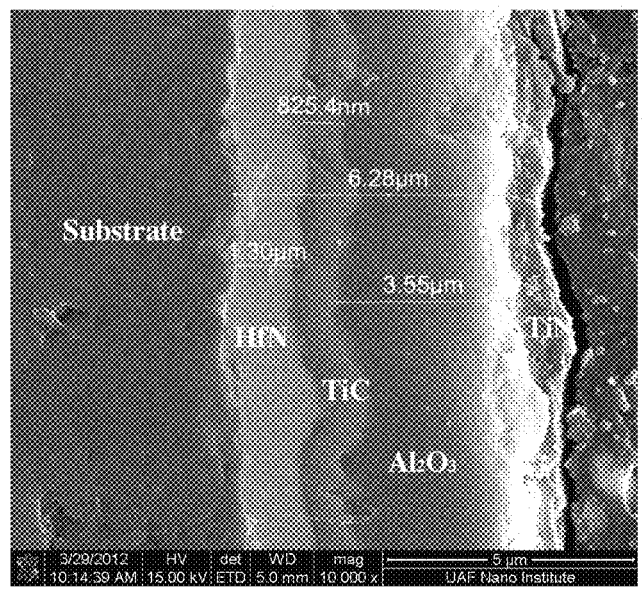
FIG. 3 is an SEM photograph of a substrate with multiple coatings according to a preferred embodiment of the present invention.

With reference to FIG. 1, a preferred embodiment of the present invention for use in connection with a cutting tool insert may be described. A substrate 10 forms a base for the tool insert. Substrate 10 may preferably be formed of at least one of a carbide, a nitride, or a ceramic material. In the case of a carbide, the carbide may be various carbides of different particle sizes and different binder materials. In certain embodiments, the carbide substrate may be the combination of tungsten carbides of different particle sizes, preferably nano-sized to sub-micron sized particles, with cobalt or nickel as a constituent binding element in a percentage by weight ranging between 1.0% and 15.0%. The ceramic may be one or a combination of silicon nitride, silicon nitride with the addition of any toughening or reinforcing agents as are known in the art, aluminum oxide, aluminum oxide with titanium carbide, titanium carbide, titanium nitride, zirconium oxide, zirconium carbide, tungsten carbide, and aluminum nitride, or with other agents, as examples. In the case of a nitride, the substrate may be a polycrystalline cubic boron nitride with a ceramic binder. Substrate 10 may further comprise a flash coating presented immediately over substrate 10, the flash coating comprising at least one of a carbide, a nitride, or an oxide.

In the preferred embodiment, layer 12 is a deposited layer of HfN on top of substrate 10, but could also include other materials such as titanium nitride (TiN), zirconium nitride (ZrN), or zirconium carbonitride (ZrCN) in alternative embodiments. Layer 12 could also, in alternative embodiments, comprise a composite material that includes, for example, these compounds in a combination or in combination with other compounds. The layer of HfN is of a thickness less than 2 microns, preferably less than 1.5 micron. A crack-free coating may be achieved, surprisingly by using high-temperature chemical vapor deposition (CVD) methods, rather than physical vapor deposition (PVD), plasma-enhanced CVD (PECVD), or plasma-assisted CVD (PACVD). In a particular example, the process utilizes a Bernex 250 furnace. Prior to deposition, the substrate is heated up to 1100° C. at a reactor pressure in the range of 300-900 mbar. The hafnium chloride is preferably produced by the reaction of electronic grade (99.995% purity) chlorine gas with a high-purity Hf sponge (reactor grade with size of −¾"+⅛") in an air-tight reactor, pre-heated to a temperature in the range of 400° C. to 450° C. This temperature range is desirable for activating the reaction of Hf with $Cl_2$ gas. The resulting hafnium chloride ($HfCl_4$), molecular nitrogen, and molecular hydrogen are then introduced into the flow for the purposes of providing the coating. Then chemical reactions for this process are as follows:

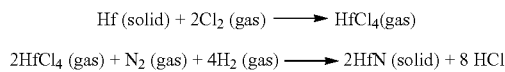

The temperature for this process may be in the range of 850° C. to 1200° C., preferably in the range of 1050° C. to 1100° C. The coating time, reactor pressure and furnace temperature used for producing the coating in the preferred embodiment is set forth below in Table I.

TABLE I

| Coating | Coating time, min | Reactor pressure, mbar | Furnace temperature, ° C. |
|---|---|---|---|
| HfN | 450 | 800 | 1080 |

The specific gas flow used for producing the coating is shown below in Table II.

TABLE II

| Coating | $H_2$ to reactor | $N_2$ to reactor | $Cl_2$ to Hf generator | $N_2$ to Hf generator |
|---|---|---|---|---|
| HfN | 30% | 47.2% | 1.4% | 22% |

It may be noted that the time for depositing the relatively thin HfN adherent layer according to this preferred embodiment is relatively short, which significantly reduces the overall time associated with the coating process, making the process more economically viable. This reduced coating time also reduces the potential damage to substrate 10 that may be caused by exposure of substrate 10—particularly in the case of a carbide substrate 10—to high temperatures for extended periods. Further, the reduced coating time lessens the likelihood of cracks appearing in the HfN layer during or after cooling.

After coating, cross-sectional analysis was used to show that the HfN coating layer that results from this procedure has a thickness of less than 2 microns, and more specifically in the range of about 1.0 microns to 1.5 microns. SEM analysis of the coating surface does not reveal any apparent cracks, as shown in the detail view photographs of FIGS. 2A and 2B, such that the surface would appear to be significantly devoid of cracks. Depending upon the surface morphology, the coating can be of a different granularity owing to the cooling conditions after the coating is completed. FIG. 2A shows the results of a coating where slow cooling was applied (i.e., a cooling time of about 4 to 6 hours), while FIG. 2B shows the results of a coating where quick cooling was applied (i.e., a cooling time of less than about 4 hours).

Other layers may be applied following the HfN layer in order to provide for a harder contact surface with the material to be cut by the cutting tool insert. Those materials may include, for example, titanium carbide (TiC), titanium nitride (TiN), titanium carbonitride (TiCN), zirconium carbonitride (ZrCN), and aluminum oxide ($Al_2O_3$), in various embodiments. Each of these layers may preferably be of thicknesses between a few hundred nanometers up to 40 microns, with a total coating thickness for all of the layers in the range of about 0.5 to 100 microns, and in the preferred embodiment a total thickness for all of the layers of about 8 to 10 microns. In a preferred embodiment of the invention, the layers provided are, from innermost to outermost with respect to the HfN layer 12, a layer 14 composed of TiC, a layer 16 composed of $Al_2O_3$, and a layer 18 composed of TiN. The thicknesses of each of these layers, again according to the preferred embodiment, is about 1.0 to 1.5 microns for HfN layer 12; about 1.5 to 3.5 microns for TiC layer 14; about 3 to 5 microns for $Al_2O_3$ layer 16; and about 1 to 2 microns for TiN layer 18. FIG. 3 is an SEM photograph showing layers according to an embodiment of the invention. The process parameters for deposition of these materials may be as shown in Table III for the preferred embodiment.

TABLE III

| Coating | H$_2$ | N$_2$ | HCl | TiCl$_4$ | CH$_3$CN | CH$_4$ | CO | CO$_2$ | H$_2$S | Temp, ° C. | Pressure, mbar | Duration, min |
|---|---|---|---|---|---|---|---|---|---|---|---|---|
| TiC | 87.4% | | | balanced | 3.4% | | | | | 1015 | 160 | 150 |
| Al$_2$O$_3$ | 87.46% | | 8.81% | | | | | 3.4% | balanced | 1015 | 60 | 210 |
| TiN | 63.16% | 26.32% | | balanced | | | | | | 1015 | 100 | 30 |

It may be noted that in commercial embodiments, the coating layers should preferably extend over the edges of substrate 10, but this aspect of the preferred embodiment is omitted from FIG. 1 for the sake of clarity. These layers 14, 16, and 18 may be deposited by conventional techniques. Other arrangements of material layers in alternative embodiments include, but are not limited to, HfN—TiN—TiCN—Al$_2$O$_3$ and HfN—Al$_2$O$_3$—TiC—TiN.

It may be seen that with the preferred combinatorial arrangement of coating materials, the materials used in each layer from the innermost to outermost provide a roughly gradual variation from softer to harder materials in terms of the hot hardness of the material at 1000° C.; specifically, the hot hardness for these materials is as follows: for HfN: 800-900 kgf/mm$^2$; for TiC: 200-300 kgf/mm$^2$; for Al2O3: 300-800 kgf/mm$^2$; and for TiN: about 200 kgf/mm$^2$. The materials also provide a rough gradual variation from materials of high thermal conductivity to materials of low thermal conductivity. It is believed that in this way, fracturing of the cutting tool insert is lessened because the gradual transition between properties of the materials on successive layers reduces stresses that otherwise would occur between these layers. Those stresses result in a shorter life for the cutting tool insert due to the layers shearing away from each other. This gradual transition of material properties also serves to reduce the stress particularly at the HfN layer, preventing cracks from forming as quickly as might otherwise occur due to high temperature conditions during cutting. It may be seen that the lower thermal conductivity of the upper layers serves to partially shield the lower layers to the HfN layer, which is important since HfN is a strong thermal conductor.

In alternative embodiments of the invention, the HfN layer 12 could be provided in a discontinuous rather than continuous form, or in both a continuous and a discontinuous form, either with the substrate and/or other layer coatings. Other coating layers may similarly be provided in discontinuous form or in both a continuous and discontinuous form while maintaining the gradual variation of thermal conductivity and hardness or other properties as for the preferred embodiment as described. Other deposition techniques may be used, such as chemical vapor infiltration (CVI) or hybrid techniques.

As used herein, "comprising" is synonymous with "including," "containing," or "characterized by," and is inclusive or open-ended and does not exclude additional, unrecited elements or method steps. As used herein, "consisting of" excludes any element, step, or ingredients not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

When a Markush group or other grouping is used herein, all individual members of the group and all combinations and subcombinations possible of the group are intended to be individually included in the disclosure.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims. Thus, additional embodiments are within the scope of the invention and within the following claims.

In general the terms and phrases used herein have their art-recognized meaning, which can be found by reference to standard texts, journal references and contexts known to those skilled in the art. The preceding definitions are provided to clarify their specific use in the context of the invention.

All patents and publications mentioned in the specification are indicative of the levels of skill of those skilled in the art to which the invention pertains. All references cited herein are hereby incorporated by reference to the extent that there is no inconsistency with the disclosure of this specification.

The present invention has been described with reference to certain preferred and alternative embodiments that are intended to be exemplary only and not limiting to the full scope of the present invention as set forth in the appended claims.

The invention claimed is:

1. A tool comprising:
    a. a substrate; and
    b. a first coating on and in contact with the substrate comprising hafnium nitride, wherein the first coating has a thickness of less than 2 microns.

2. The tool of claim 1, wherein the substrate comprises at least one of a carbide, a nitride, and a ceramic.

3. The tool of claim 1, wherein the substrate further comprises a flashed coating comprising at least one of a carbide, a nitride, and an oxide.

4. The tool of claim 1, wherein the first coating further comprises zirconium nitride.

5. The tool of claim 2, wherein the first coating comprises a first coating surface devoid of cracks.

6. The tool of claim 2, wherein the substrate comprises a combination of tungsten carbide particles of varying size.

7. The tool of claim 2, wherein the substrate comprises a ceramic material selected from the group consisting of silicon nitride, aluminum oxide, titanium carbide, zirconium oxide, zirconium carbide, tungsten carbide, and aluminum nitride.

8. The tool of claim 7, wherein the substrate further comprises at least one of toughening and reinforcing agents.

9. The tool of claim 2, wherein the substrate comprises a polycrystalline cubic boron nitride and a ceramic binder.

10. The tool of claim 1, further comprising a second coating on and in contact with the first coating, wherein the second coating comprises a material selected from the group consisting of titanium carbide, titanium carbonitride, zirconium nitride, zirconium carbonitride, and aluminum oxide.

11. The tool of claim 10, wherein the second coating comprises a thickness no greater than about 40 microns.

12. The tool of claim 10, wherein the second coating comprises titanium carbide.

13. The tool of claim 12, further comprising a third coating on and in contact with the second coating, wherein the third coating comprises a material selected from the group consisting of titanium carbide, titanium carbonitride, zirconia carbonitride, and aluminum oxide.

14. The tool of claim 13, wherein the third coating comprises aluminum oxide.

15. The tool of claim 14, further comprising a fourth coating on and in contact with the third coating, wherein the fourth coating comprises a material selected from the group consisting of titanium carbide, titanium nitride, titanium carbonitride, zirconia carbonitride, and aluminum oxide.

16. The tool of claim 15, wherein the fourth coating comprises titanium nitride.

17. The tool of claim 1, further comprising an additional coating over the first coating, wherein the additional coating has a hardness that is greater than a hardness of the first coating, and wherein the additional coating has a lower measure of thermal conductivity than a measure of thermal conductivity for the first coating.

18. The tool of claim 17, further comprising a plurality of additional coatings over the first coating, wherein each additional coating has a hardness that is greater than a hardness of the coating that is immediately beneath such coating, and wherein each additional coating has a lower measure of thermal conductivity than a measure of thermal conductivity of the coating that is immediately beneath such coating.

* * * * *